US008922301B1

(12) United States Patent
Williams et al.

(10) Patent No.: US 8,922,301 B1
(45) Date of Patent: Dec. 30, 2014

(54) HIGH QUALITY-FACTOR RESONATOR

(75) Inventors: John D. Williams, Decatur, AL (US);
Reza Kamali-Sarvestani, Blackwood, NJ (US)

(73) Assignee: Board of Trustees of the University of Alabama, for and on behalf of the University of Alabama in Huntsville

( * ) Notice: Subject to any disclaimer, the term of this patent is extended or adjusted under 35 U.S.C. 154(b) by 356 days.

(21) Appl. No.: 13/283,138

(22) Filed: Oct. 27, 2011

Related U.S. Application Data

(60) Provisional application No. 61/408,577, filed on Oct. 30, 2010.

(51) Int. Cl.
*H03H 7/01* (2006.01)
(52) U.S. Cl.
CPC .................................... *H03H 7/175* (2013.01)
USPC ........................................................ 333/185
(58) Field of Classification Search
CPC .............................. H03H 7/175; H03H 7/1741
USPC ........................... 333/185, 176, 167, 172, 175
See application file for complete search history.

(56) References Cited

U.S. PATENT DOCUMENTS

| 6,806,793 | B2 * | 10/2004 | Bhatia et al. | 333/175 |
| 7,342,470 | B2 | 3/2008 | Bassali | |
| 2009/0086451 | A1 * | 4/2009 | Kim et al. | 361/762 |
| 2010/0252315 | A1 * | 10/2010 | Liao et al. | 174/260 |

OTHER PUBLICATIONS

Ziolkowski, et al., "A High-Q Reconfigurable Planar EBG Cavity Resonator," IEEE Microwave and Wireless Component Letters, vol. 11, No. 6, Jun. 2001.

* cited by examiner

*Primary Examiner* — Stephen Jones
*Assistant Examiner* — Scott S Outten
(74) *Attorney, Agent, or Firm* — Maynard Cooper & Gale, P.C.; Jon E. Holland

(57) ABSTRACT

A high-Q factor resonator comprises a solenoid having an embedded capacitor assembled in a machineable high-frequency dielectric printed circuit board ("PCB"), or other substrate. The solenoid comprises a plurality of surface conductors positioned on upper and lower surfaces of the PCB. The solenoid further comprises a plurality of conductive vias extending through the PCB between the surface conductors, and at least two aligned vias are separated by a capacitive gap. The device can therefore be described as a coupled circuit having a 1.5 or more turn inductor with an embedded capacitor along the length of the conductive path. Accordingly, a resonator having a high-Q factor is provided which is relatively inexpensive and easy to fabricate.

15 Claims, 8 Drawing Sheets

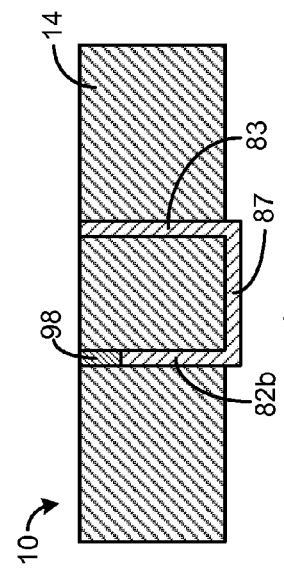
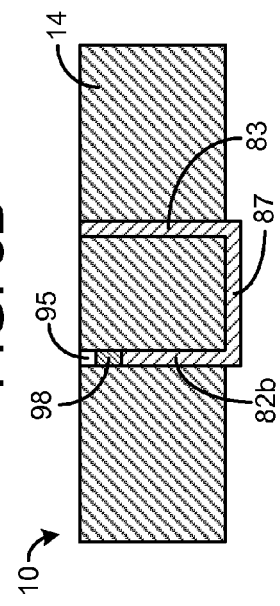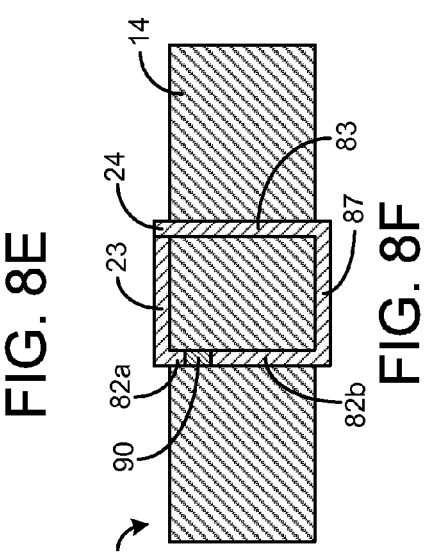
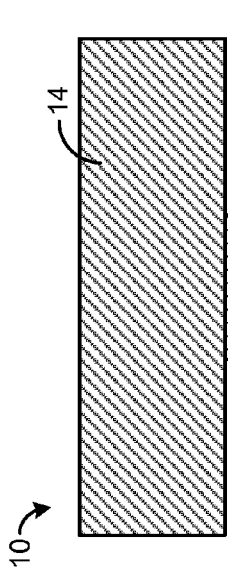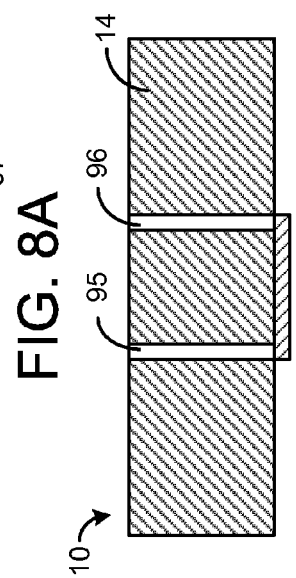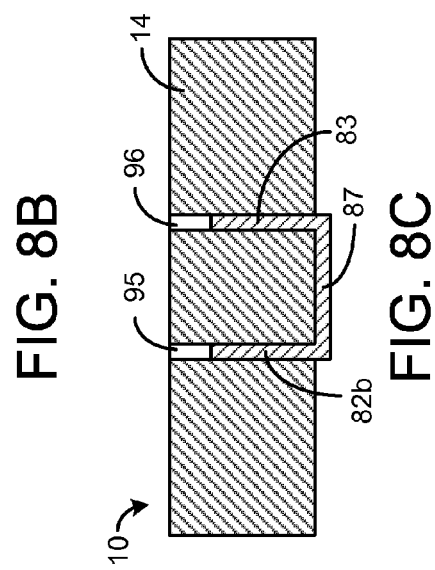

HIGH QUALITY-FACTOR RESONATOR

CROSS REFERENCE TO RELATED APPLICATION

This application claims priority to U.S. Provisional Patent Application No. 61/408,577, entitled "High Quality-Factor Resonator" and filed on Oct. 30, 2010, which is incorporated herein by reference.

RELATED ART

Radio frequency micro-structured resonators are typically used to optimize the transmission and filtering features for microwave applications such as, for example, radars, satellite communications, and medical applications. The most commonly used parameter to design and fabricate these resonators is quality factor ("Q-factor"), which indicates performance of the resonator. It is generally desirable to produce resonators having a high Q-factor, and various design techniques have been employed to increase the Q-factor of current resonators.

Examples of design techniques for increasing Q-factor in resonators typically include on-chip resonator designs such as, for example, spiral coils, micro-solenoids, and cavity resonators. However, parasitic capacitance between the coil and the substrate of the coil has an adverse impact on the performance on the resonator, resulting in lower Q-factors. Current techniques for overcoming such parasitic capacitance in the resonator often require complex fabrication using expensive and unreliable materials. Accordingly, a reliable, relatively inexpensive and easily fabricated resonator with a high Q-factor is desired.

BRIEF DESCRIPTION OF THE DRAWINGS

The present disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

FIGS. 8A-8F depict exemplary cross-sectional views of the resonator of FIG. 2 during an exemplary manufacturing process.

DETAILED DESCRIPTION

Embodiments of the present disclosure generally pertain to high-Q factor resonators and methods of fabricating the same. A high-Q factor resonator in accordance with an exemplary embodiment of the present disclosure comprises a solenoid having an embedded capacitor assembled in a machinable high-frequency dielectric printed circuit board ("PCB") or other substrate. The solenoid comprises a plurality of surface conductors positioned on upper and lower surfaces of the PCB. The solenoid further comprises a plurality of conductive vias extending through the PCB between the surface conductors, and at least two aligned vias are separated by a capacitive gap. The device can therefore be described as a coupled circuit having a 1.5 or more turn inductor with an embedded capacitor along the length of the conductive path. Accordingly, a resonator having a high-Q factor is provided which is relatively inexpensive and easy to fabricate.

Figure 1:
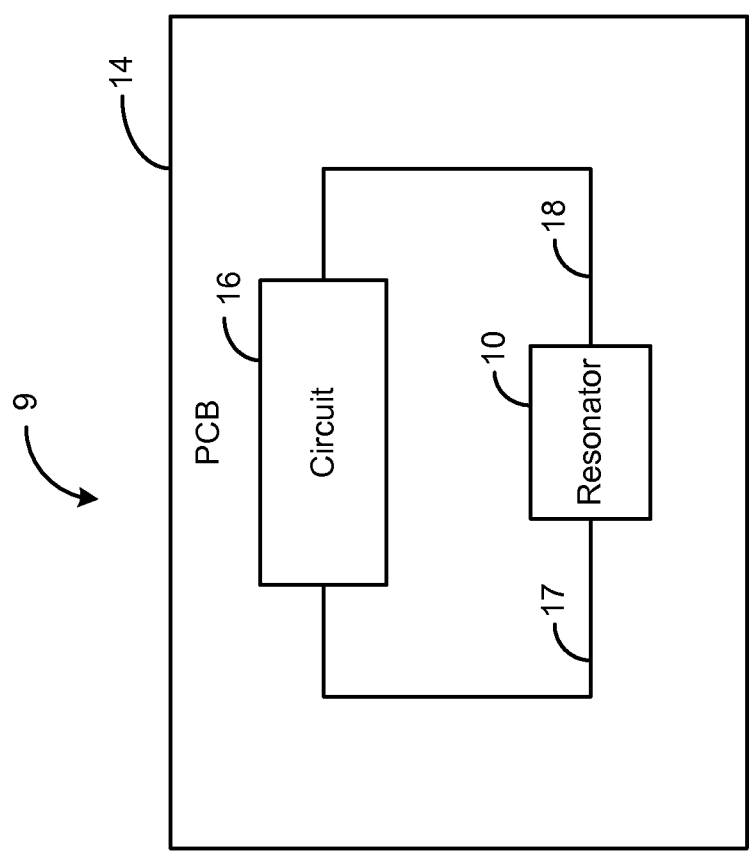
FIG. 1 is a block diagram depicting an exemplary embodiment of a system employing a resonator implemented in a printed circuit board.

FIG. 1 depicts an exemplary embodiment of a system 9 having a resonator 10 implemented in a microwave frequency printed circuit board ("PCB") 14, which forms a dielectric substrate having a low relative permittivity. In one embodiment, the PCB 14 is composed of Duroid having a relative permittivity of 2.2, although other types of materials may be used for the PCB 14 in other embodiments. Further, other types of materials and substrates may be used in other embodiments. As an example, the substrate in which the resonator 10 is embedded may be composed of a ceramic, glass, or plastic with dielectric constants near the desired resonant frequency of the system 9.

Formed on the PCB 14 is a circuit 16 which is configured to perform one or more functions, as may be desired, depending on the intended application. In one embodiment, the circuit 16 transmits, receives, and processes data signals for use in microwave applications, although other types of circuits are possible in other embodiments. The configuration and operation of the circuit 16 are not important for aspects of this disclosure, and the circuit 16 will not be described in detail herein.

The resonator 10 comprises a solenoid (not shown in FIG. 1), discussed in more detail hereafter, embedded in the PCB 14. The resonator 10 is coupled to the circuit 16 via a plurality of conductive connections 17 and 18 (e.g., copper traces). The resonator 10 is configured to receive data signals from the circuit 14 via the connections 17 and 18 and to increase the resonance frequency and the Q-factor of the data signals received from the circuit 16. Note that the resonator 10 is relatively inexpensive to manufacture and easy to fabricate, as will be described in more detail hereafter. As will be described in more detail hereafter, embedded within the solenoid is a capacitor (not shown in FIG. 1), and the configuration of the capacitor within the solenoid controls various resonator characteristics, such as resonant frequency and Q-factor.

Figure 2:
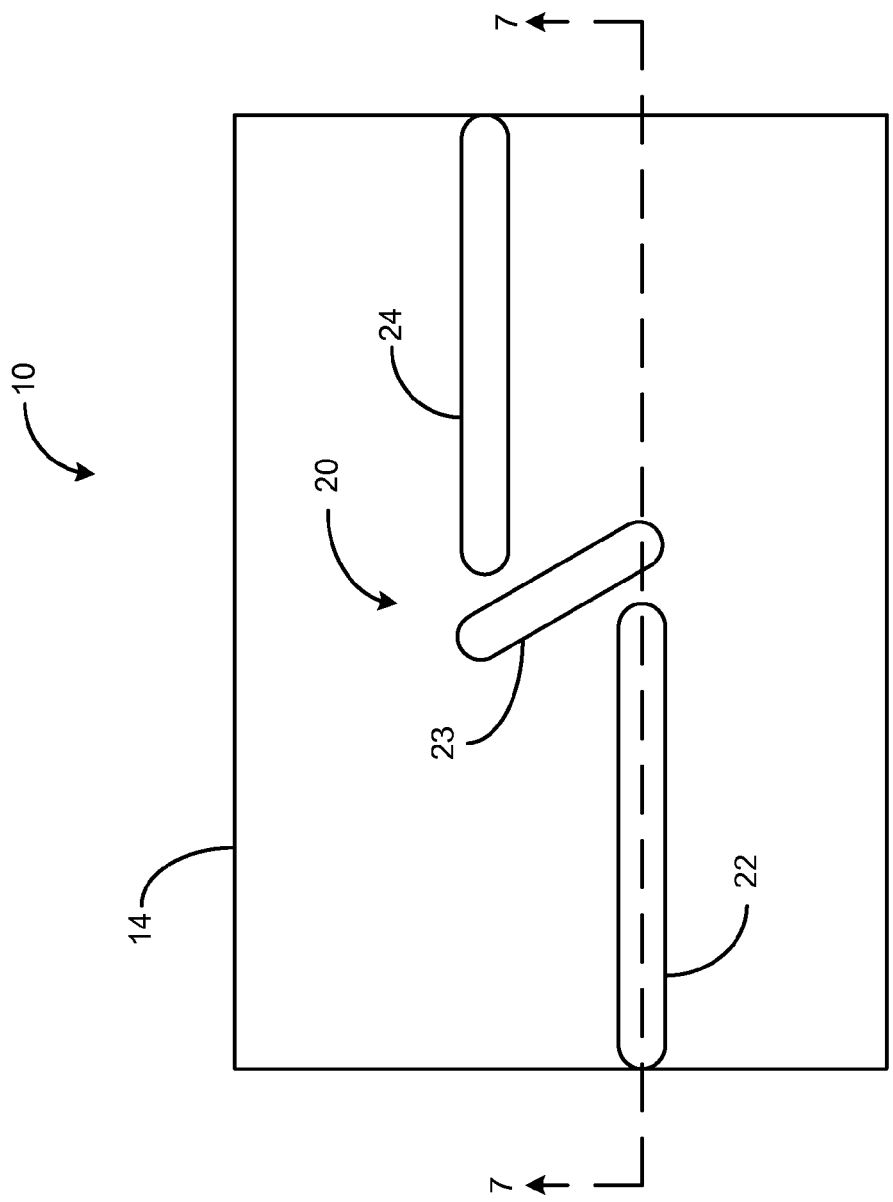
FIG. 2 is a block diagram depicting a top view of an exemplary embodiment of a resonator, such as is depicted by FIG. 1.

FIG. 2 depicts a top view of an exemplary embodiment of a resonator 10. As shown by FIG. 2, the resonator 10 comprises a solenoid 20 embedded in the PCB 14. The solenoid 20 comprises a plurality of conductors 22, 23, 24, referred to hereafter for clarity as "top surface conductors," positioned on a top surface of the PCB 14. Note that, in other embodiments, it is unnecessary for the conductors 22, 23, 24 to be positioned on a top surface of the PCB 14 or other substrate. The top surface conductors 22 and 24 are coupled to the connections 17 and 18 (FIG. 1), respectively. The solenoid 20 comprises conductive material, such as, for example, copper, although other conductive materials may be used in other embodiments, and the solenoid 20 forms at least one turn. The solenoid 20 further comprises a plurality of vias (not shown in FIG. 2) and a plurality of conductors (not shown in FIG. 2) positioned on a bottom surface of the PCB 14, discussed in more detail hereafter. As will be described in more detail hereafter, embedded within the solenoid 20 is a capacitor (not shown in FIG. 2), which is formed by a dielectric substance positioned within a turn of the solenoid 20. Specifically, the dielectric substance is positioned between and separates vias that form a part of the solenoid and shall be referred to as a "capacitive gap." Such a solenoid shall be referred to herein as a "capacitor embedded solenoid."

Figure 3:
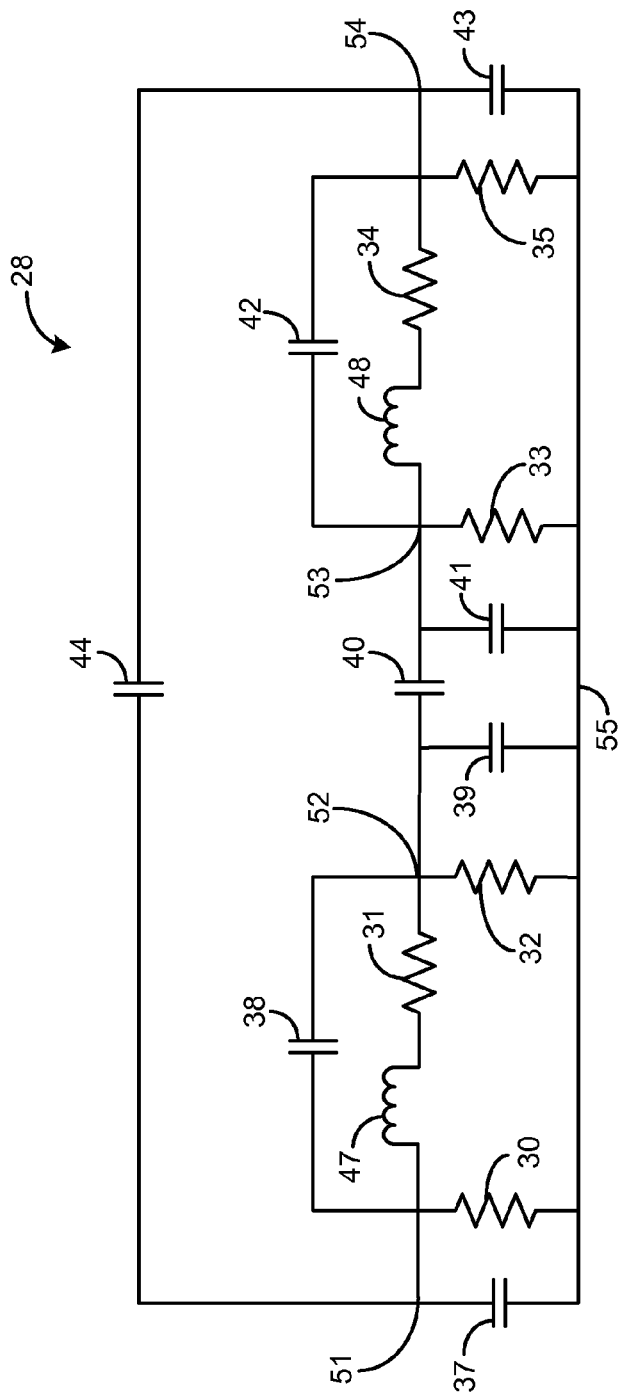
FIG. 3 is a circuit diagram depicting an exemplary circuit for simulating a resonator, such as is depicted by FIG. 2.

FIG. 3 depicts a circuit for simulating the embodiment of the resonator 10 shown by FIG. 2. The circuit 28 comprises a plurality of resistors 30-35, a plurality of capacitors 37-44, and a plurality of inductors 47 and 48 coupled across a plurality of nodes 51-55. The capacitor 37 and the resistor 30 are coupled in parallel between the node 51 and the node 55. The inductor 47 and the resistor 31 are coupled in series between the node 51 and the node 52, and the capacitor 38 is coupled in parallel to the inductor 47 and the resistor 31 between the node 51 and the node 52. The resistor 32 and the capacitor 39 are coupled in parallel between the node 52 and the node 55, and the resistor 33 and the capacitor 41 are coupled in parallel between the node 53 and the node 55. The capacitor 40 is coupled between the node 52 and the node 53.

Furthermore, the resistor 35 and the capacitor 43 are coupled in parallel between the node 54 and the node 55, and the inductor 48 and the resistor 34 are coupled in series between the node 53 and the node 54. The capacitor 42 is coupled in parallel to the inductor 48 and the resistor 34 between the node 53 and the node 54. The capacitor 44 is coupled between the node 51 and the node 54.

The capacitors 37-44 represent the capacitance of the resonator 10 (FIG. 1). The capacitors 37, 39, 41, and 43 represent the parallel capacitance of the resonator 10, the capacitor 40 represents the series capacitance of the resonator 10, and the capacitor 44 represents the stray capacitance of the resonator 10. The series capacitor 40 represents a capacitive gap (not shown in FIG. 2) in the capacitor embedded solenoid 20 (FIG. 2), discussed in more detail hereafter, which effectively divides the circuit 28 into two circuits thereby increasing the resonance frequency of the resonator 10. Such an increase in the resonance frequency of the resonator 10 transfers a dominant pole of the resonator 10 which increases the frequency distance between the pole and zero, thereby raising the Q-factor of the resonator 10. The resistors 30-35 represent the series conductor resistance of the resonator 10, and the inductors 47 and 48 represent the self inductance of the resonator 10. Accordingly, the circuit diagram depicted by FIG. 3 simulates a double zero double pole resonator 10 wherein the Q-factor is increased.

Figure 4:
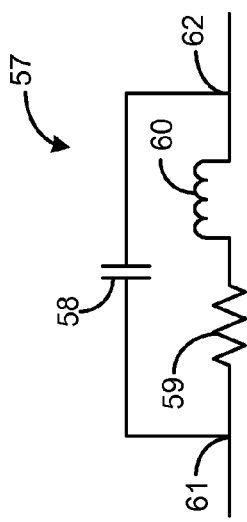
FIG. 4 is a circuit diagram depicting an exemplary simplified circuit for simulating a resonator, such as is depicted by FIG. 2.

FIG. 4 depicts a simplified circuit for simulating the embodiment of the resonator 10 shown by FIG. 2. The circuit 57 comprises a capacitor 58, a resistor 59, and an inductor 60 coupled across a plurality of nodes 61 and 62. The resistor 59 and the inductor 60 are coupled in series between the nodes 61 and 62, and the capacitor 58 is coupled in parallel to the resistor 59 and the inductor 60 between the nodes 61 and 62. The capacitor 58 represents the stray capacitance of the resonator 10 (FIG. 1), the resistor 59 represents the series resistance of the conductive portions of the resonator 10, and the inductor 60 represents the self inductance of the resonator 10. The simplified circuit 57 simulates the resonator 10 for each resonance frequency.

Figure 5:
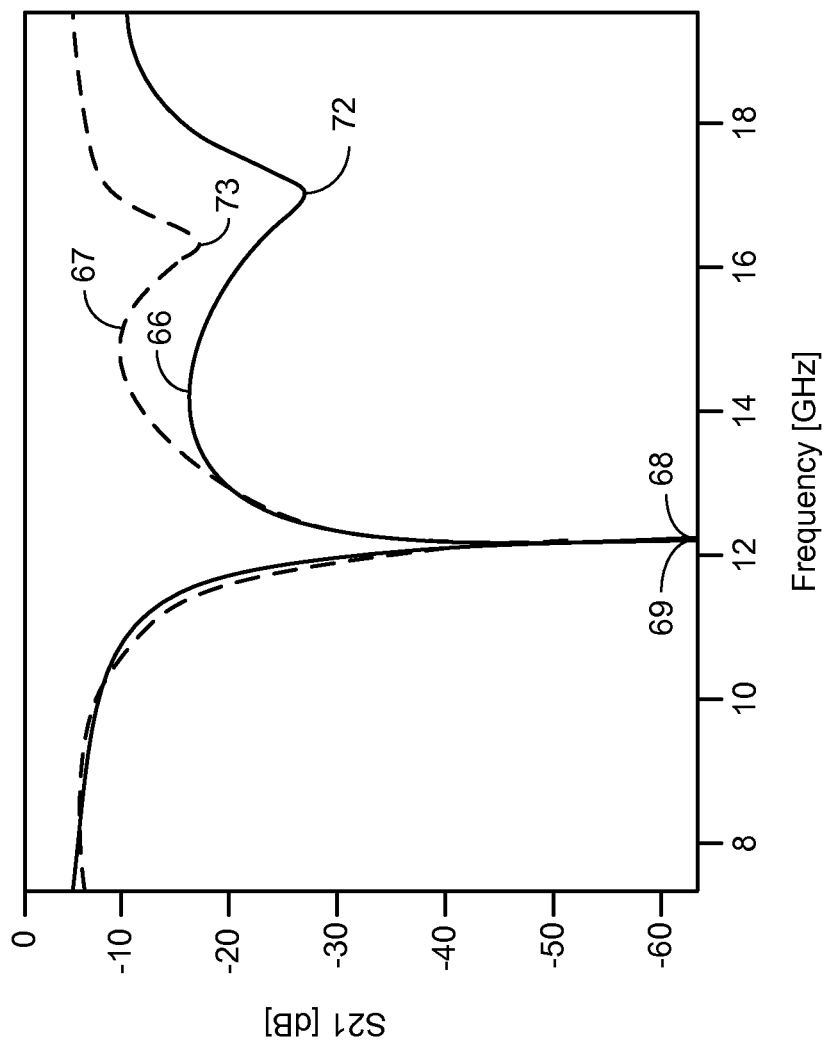
FIG. 5 is a graph depicting exemplary simulated and actual measurement results of a resonator, such as is depicted by FIG. 2.

FIG. 5 depicts simulated and actual measured results for an exemplary embodiment of a resonator 10. The simulated results 66 are represented by a solid line, while the measured results 67 are represented by a dashed line. The circuit 28 (FIG. 3) was used to obtain the simulated results 66, and the measured results 67 were obtained by setting the capacitive gap (not shown) of the resonator 10 (FIG. 1) at 0.375 millimeters (mm) below the top surface conductor 23, as will be discussed in more detail hereafter. As illustrated in FIG. 5, the first pole 68 of the simulated results 66 occurred at approximately 12.27 Gigahertz (GHz), while the first pole 69 of the measured results 67 occurred at approximately 12.25 GHz. Thus the first poles 68 and 69 of the simulated 66 and measured results 67, respectively, are about the same.

The second pole 72 of the simulated results 66, however, occurred at approximately 16.89 GHz, while the second pole 73 of the measured results 67 occurred at approximately 16.15 GHz. Thus, the second pole 73 of the measured results 67 occurred approximately 740 MHz before the second pole 72 of the simulated results 66. Such a discrepancy could be due to factors such as, for example, inaccurate drilling or smaller dielectric size used in the capacitor embedded solenoid 20 (FIG. 1), discussed in more detail hereafter. Despite the difference in the second poles 72 and 73, the measured results 67 show that the poles 69 and 73 are relatively far apart. As the distance between the poles 69 and 73 increases, the Q-factor of the resonator 10 increases, with a maximum Q-factor occurring when the distance between the poles 69 and 73 is approximately 5 GHz. The distance between the poles 69 and 73, as shown by FIG. 5, is approximately 3.9 GHz. Accordingly, measured results 67 produced a Q-factor of about 306, which is relatively high. The simulated results 66 produced a Q-factor of about 480 or higher, which shows that even higher measured results 67 are likely possible for the resonator 10. Changing the dimension of the lines, capacitive distances, or capacitive areas in the capacitor embedded solenoid 20 alters the configuration such that larger or shorter distances between poles may be realized. Such changes modify the capacitor embedded solenoid 20 to provide a similar notch filter result over a range of desired quality factors and resonant frequencies between about 0.5 and 15 GHz.

Figure 6:
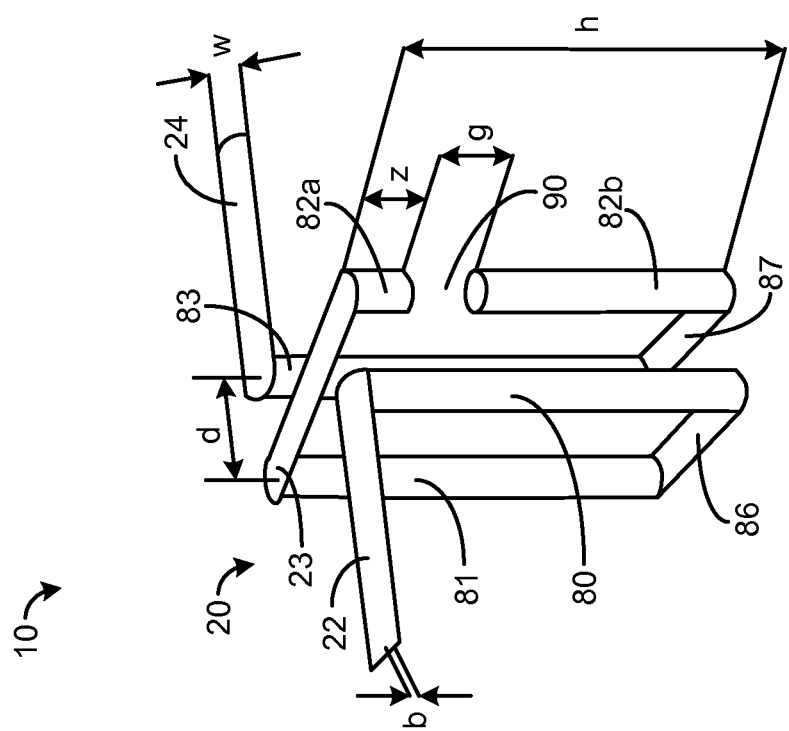
FIG. 6 is a perspective view of the exemplary resonator of FIG. 2.

FIG. 6 depicts a perspective view of the exemplary resonator 10 of FIG. 2. The resonator 10 comprises the solenoid 20 embedded in the PCB 14 (FIG. 1). The capacitor embedded solenoid 20 comprises the top surface conductors 22-24 positioned on the top surface of the PCB 14, a plurality of vias 80-83 extending through the PCB 14, and a plurality of conductors 86 and 87, referred to hereafter for clarity as "bottom surface conductors," positioned on the bottom surface of the PCB 14. Note that, in other embodiments, it is unnecessary for the conductors 86 and 87 to be positioned on a bottom surface of the PCB 14 or other substrate. In one embodiment, the top surface conductors 22-24, the vias 80-83, and the bottom surface conductors 86 and 87 comprise copper, although other conductive materials are possible in other embodiments. The via 80 extends vertically from an end of the top surface conductor 22 through the PCB 14 to an end of the bottom surface conductor 86. The via 81 extends vertically from another end of the bottom surface conductor 86 through the PCB 14 to an end of the top surface conductor 23. Furthermore, the via 83 extends vertically from an end of the bottom surface conductor 87 to an end of the top surface conductor 24.

The via 82a extends downwardly into the PCB 14 from an end of the top surface conductor 23, and the via 82b extends vertically from an end of the bottom surface conductor 87. The vias 82a and 82b are vertically aligned with one another and are separated by a capacitive gap 90. Ideally, the centerlines of the vias 82a and 82b are precisely aligned but such precise alignment is unnecessary. The vias 82a and 82b are preferably sufficiently aligned to enable the gap 90 to provide a desired capacitance for increasing the Q-factor. In this regard, the gap 90 capacitance provided by the gap 90 effectively divides the capacitor embedded solenoid 20 into two circuits thereby dividing the inductance, resistance, and stray capacitance of the resonator 10. Accordingly, the resonance frequency is increased, which results in a relatively high Q-factor. In one embodiment, the gap 90 comprises dielectric material, such as, for example, Duroid. However, other substances such as, for example, air or plastic, may be used for the gap 90 in other embodiments.

In one embodiment, each via 80-83 is cylindrical with a radius (r) of about 125 micrometers ($\mu m$). For a GHz frequency systems 9, the diameter of the vias 80-83 is preferably selected to be about 200 $\mu m$ or less. To support mechanical and laser machining of the PCB 14, the diameter of the vias 80-83 is preferably selected to be about 75 $\mu m$ or greater. Accordingly, a desired diameter of the vias 80-83 may be in the range of about 75 to 200 $\mu m$ for some applications. The height (h) of the vias 80, 81, and 83 is approximately equal to the thickness of the PCB 14, which is about 3.02 millimeters (mm). Also, the width (w) of the top surface conductors 22-24 and the bottom surface conductors 86 and 87 is approximately 250 $\mu m$. The distance (d) between the top surface conductors 22-24 is also about 250 $\mu m$, and the thickness (b) of each top surface conductor 22-24 is about 35 $\mu m$. However, it should be emphasized that such dimensions are exemplary, and other dimensions are possible in other embodiments.

Furthermore, the gap 90 is positioned a distance (z) below the top surface conductor 23. Thus, the height of the via 82a is set forth as the distance (z). In one embodiment, the distance (z) is about 375 $\mu m$, although other distances (z) are possible in other embodiments. Also, the thickness (g) of the gap 90 (i.e., the distance from the via 82a to the via 82b) is about 500 $\mu m$ in one embodiment. Other thicknesses (g) of the gap 90 are possible in other embodiments. Furthermore, the height of the via 82b is equal to about 2.15 mm, the distance (z) is about 375 $\mu m$ and the thickness (g) is about 500 $\mu m$. Other heights of the via 82b are possible in other embodiments depending on the thickness of the PCB 14, the distance (z), and the thickness (g). The thickness (g) of the gap 90 and the distance (z) of the gap 90 below the conductor 23 directly affect the location of the poles 69 and 73 (FIG. 5), which affects the Q-factor. As the frequency distance between the poles 69 and 73 increases, the Q-factor increases up to a point, with a maximum Q-factor occurring when the frequency distance between the poles 69 and 73 is approximately 5 GHz. Thus, the location and the thickness (g) of the gap 90 are significant and may be adjusted in order to tune the resonator 10. With a distance (z) of about 375 $\mu m$, a thickness (g) of about 500 $\mu m$, and a frequency of about 12.25 GHz, the resonator 10 of FIG. 6 should produce a frequency distance of 3.9 GHz between the poles 69 and 73, resulting in a Q-factor of about 306. The Appendices provide additional details regarding how the resonator 10 may be tuned to achieve a desired result.

Figure 7:
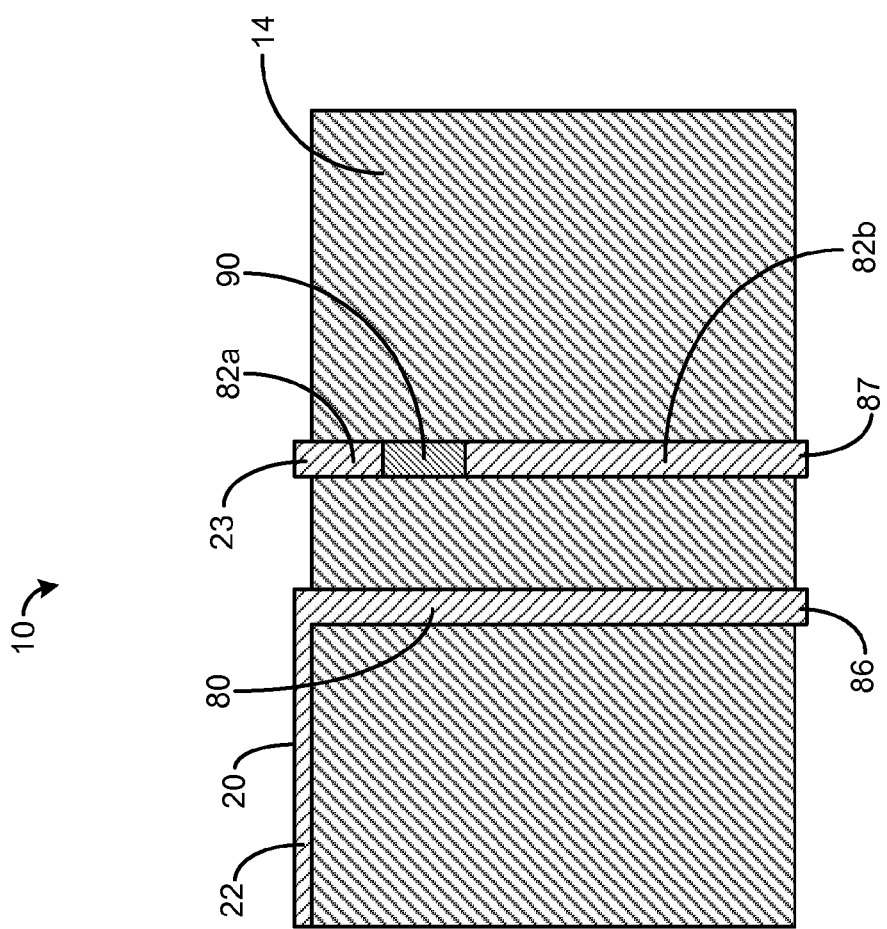
FIG. 7 is a cross-sectional view of the exemplary resonator of FIG. 2.

FIG. 7 depicts a cross-sectional view of the resonator 10 of FIG. 2. As shown by FIG. 7, the resonator 10 comprises the solenoid 20 embedded within the PCB 14. The capacitor embedded solenoid 20 comprises the top surface conductors 22 and 23 positioned on the top surface of the PCB 14, bottom surface conductors 86 and 87 positioned on the bottom surface of the PCB 14, and vias 80, 82a and 82b extending through the PCB 14. The top surface conductor 22 is positioned horizontally on the top surface of the PCB 14. The via 80 extends perpendicularly from the top surface conductor 22, through the PCB 14, and to the bottom surface conductor 86.

Similarly, the top surface conductor 23 is positioned on the top surface of the PCB 14, and the via 82a extends perpendicularly from the top surface conductor 23 into the PCB 14. The via 82b extends perpendicularly from the bottom surface conductor 87 and into the PCB 14. The vias 82a and 82b are separated by a capacitive gap 90, which as shown by FIG. 7 is positioned within the PCB 14. In one embodiment, the capacitive gap 90 comprises dielectric material having a low relative permittivity such as, for example, Duroid® having a relative permittivity of 2.2. In other embodiments, other substances or materials may be used in the vias 82a and 82b to create the capacitive gap 90. For example, in one embodiment, the capacitive gap 90 merely comprises air, although plastics and other materials are possible. Furthermore, when fabricating the resonator 10, a via hole (not shown in FIG. 7), described in more detail hereafter, may be drilled or otherwise formed completely through the PCB 14 to enable formation of the vias 82a and 82b above and below the gap 90, which comprises material inserted into the PCB 14. However, in another embodiment, two aligned via holes (not shown in FIG. 7) may extend partially through the PCB 14 from the top and bottom surfaces of the PCB 14 such that the via 82a extends a distance (z) (FIG. 6) into the PCB 14 from the top surface, the via 82b extends partially through the PCB 14 from the bottom surface, and the vias 82a and 82b are separated by the gap 90 which comprises the PCB 14 material remaining between the via holes (not shown in FIG. 7).

FIGS. 8A-8F are cross-sectional views depicting an exemplary embodiment of a resonator 10 during manufacturing. Initially, the bottom surface connectors 86 (FIGS. 6) and 87 are formed on the bottom surface of the PCB 14, as shown by FIG. 8A and block 110 of FIG. 9. In one embodiment, the PCB 14 is about 3.08 mm thick. As set forth above, in one embodiment, the bottom surface connectors 86 and 87 comprise copper cladding which is approximately 35 $\mu m$ thick. Silver immersion layer technology may be used to form the connectors 86 and 87. However, bottom surface connectors 86 and 87 comprising different materials and having different thicknesses are possible in other embodiments.

Figure 9:
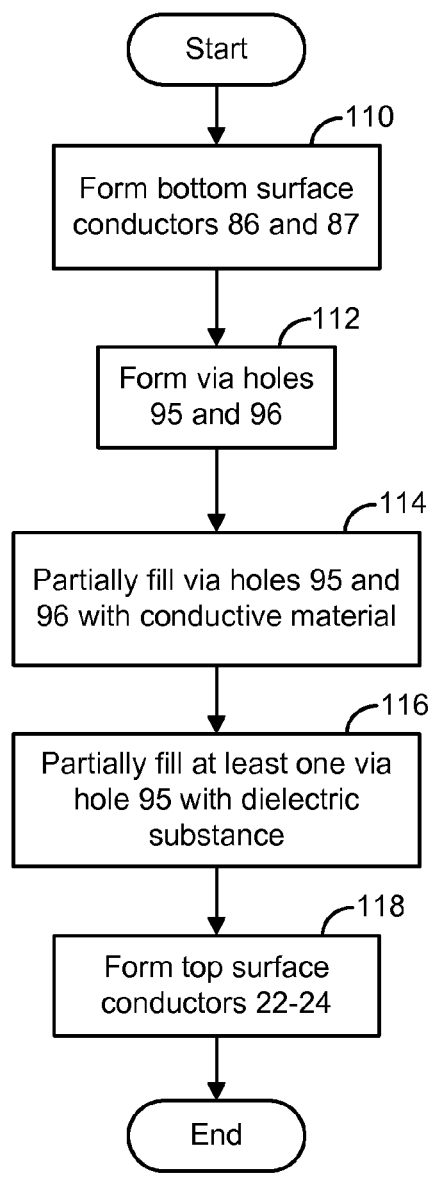
FIG. 9 is a flowchart illustrating an exemplary method of manufacturing an exemplary resonator, such as is depicted by FIG. 2.

After formation of the bottom surface connectors 86 and 87, a plurality of via holes 95 and 96 are drilled, as shown by FIG. 8B and block 112 of FIG. 9. Note that via holes (not shown) are also drilled for each of the vias 80 and 81 (FIG. 6). Such via holes (not shown) are drilled and fabricated identically to the via hole 96 but are hidden in FIG. 7. In one embodiment, the via holes 95 and 96 are drilled with a laser drill. However, other drilling methods, such as, for example, pulse energy drills or drill presses may be used in other embodiments. The via holes 95 and 96 are drilled with a radius size of approximately 125 $\mu m$ and extend from the top surface of the PCB 14 to the bottom surface of the PCB 14, although other dimensions are possible in other embodiments. For example, in another embodiment, the via hole 95 may be drilled from the bottom and top of the PCB 14 such that the via hole 95 only extends partially through the PCB 14.

In one embodiment, the width (w) (FIG. 6) of each of the top surface conductors 23 and 24 is approximately 250 $\mu m$. Furthermore, the distance (d) (FIG. 6) between via 83 and the via 81 (FIG. 6) is about 250 $\mu m$ and the distance (d) between the via 82*a* and the via 80 is also about 250 μm. However, other dimensions are possible in other embodiments. Though other drilling methods and dimensions may be used, the exemplary drilling methods and dimensions described above are standard in the industry, which facilitates ease of fabrication and allows for inexpensive manufacturing of the exemplary resonator 10.

After formation of the via holes 95 and 96, electroplating is used to form the via 82*b* and apportion of the via 83, as shown by FIG. 8C and block 114 of FIG. 9. In one embodiment, the via holes 95 and 96 are electroplated up to a certain height with copper or other conductive material. In one embodiment, the via holes 95 and 96 are electroplated to a height of approximately 2.2 mm from the bottom surface of the PCB 14, although other heights are possible in other embodiments.

As shown by FIG. 8D and block 116 of FIG. 9, the via hole 95 (FIG. 8C) is sealed with dielectric material, and electroplating or other conductive via fill material is used to complete the formation of the via 83. In one embodiment, the dielectric material 98 comprises KMPR® negative photoresist. However, the via 82*a* may be sealed with other dielectric material in other embodiments. The resonator 10 is then placed in an oven in order to allow the photoresist to dry for about 40 minutes at approximately 90 degrees Celsius. The dielectric material 98 forms the capacitive gap 90 (FIG. 6) between the via 82*b* and the via 82*a* (FIG. 6). The upper portion of the via 83 is electroplated with copper or another conductive material to the top surface of the PCB 14 to complete the via 83.

As shown by FIG. 8E, the dielectric material 98 is drilled to a distance (z) (FIG. 6) below the top surface of the PCB 14 to form a via hole 95 above such material 98. In one embodiment, the via hole 95 is drilled to a distance (z) of about 375 μm, although other distances (z) are possible in other embodiments. As set forth above, the drilling may be done with a laser drill, a pulse energy drill, a drill press, or any other standard drill. Note that he drilling in this step is done directly into the dielectric material 98 rather than into the PCB 14. As set forth above, the via hole 95 is drilled with a radius of about 125 μm. Once drilling is complete, the height of the dielectric material 98 within the via hole 95, which is also the size (g) (FIG. 6) of the capacitive gap 90 (FIG. 6), is approximately 500 μm. However, the distance (z) and the size (g) may vary in other embodiments.

Electroplating is used to fill the via hole 95 thereby forming the via 82*a*, and the top conductors 23 and 24 are formed on the PCB 14, as shown by FIG. 8F. The via 82*a* is completed by electroplating or otherwise such that the via 82*a* extends from the top of the dielectric material 98 to the top surface of the PCB 14. In one embodiment, photolithography and gold sputtering are used to form the via 82*a* in order to reduce surface oxidation. The height of the via 82*a* is approximately equal to the distance (z) (FIG. 6). In one embodiment, the height of the via 82*a* is approximately 375 μm. When the via 82*a* is completed, the dielectric material 98 forms the capacitive gap 90 between the vias 82*a* and 82*b* which allows the resonator 10 to have a high Q-factor.

Once the via 82*b*, the gap 90 and the via 82*a* are formed, the top surface conductors 23 and 24 are fabricated, as shown by block 118 of FIG. 9. Note that the top surface conductor 22 (FIG. 6) can also be fabricated in this step, but such conductor 22 is hidden in FIG. 8F. In one embodiment, the top surface conductors 23 and 24 comprise copper cladding which is about 35 μm thick. However, other conductive materials having different thicknesses are possible in other embodiments. The top surface conductor 24 extends between the top of the via 83 and the connection 18 (FIG. 1). The top surface conductor 23 extends between the top of the via 82*a* and the top of the via 81 (FIG. 6), and the top surface conductor 22 (FIG. 6) extends between the top of the via 80 (FIG. 6) and the connection 17 (FIG. 6), thus forming the capacitor embedded solenoid 20 (FIG. 6) having a generally rectangular shape.

Figure 10:
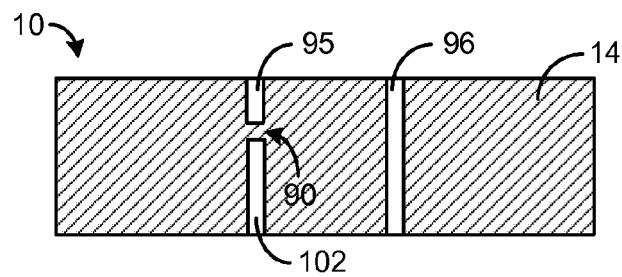
FIG. 10 depicts an exemplary cross-sectional view of the resonator of FIG. 2 during an exemplary manufacturing process.

Note that the exemplary manufacturing techniques described above are exemplary, and other manufacturing techniques are possible. As an example, FIG. 10 depicts a resonator 10 during manufacturing where a hole 95 has been drilled in a top surface of the substrate 14, and a hole 102 aligned with the hole 95 has been drilled in a bottom surface of the substrate 14. The hole 95 may be filled with conductive material via electroplating or otherwise to form via 82*a*, and the hole 102 may be filled with conductive material via electroplating or otherwise to form via 82*b*. In such embodiment, a portion of the substrate 14 between the vias 82*a* and 82*b* forms the capacitive gap 90.

Appendices A-C describe various embodiments and theory regarding the present disclosure. It should be emphasized that the embodiments described in the Appendices are exemplary, and various modifications and changes to the embodiments describer therein would be apparent to a person of ordinary skill.

Now, therefore, the following is claimed:

1. A resonator, comprising:
   a capacitor embedded solenoid embedded in a substrate composed of dielectric material, the solenoid having a plurality of conductive traces on a first surface of the substrate, a plurality of conductive traces on a second surface of the substrate, and a plurality of conductive vias extending through the substrate between the conductive traces on the first surface and the conductive traces on the second surface, the plurality of conductive vias including at least a first via, a second via, and a third via,
   wherein the first via extends from one of the traces on the first surface to one of the traces on the second surface, wherein the second conductive via extends from one of the traces on the first surface, wherein the third via extends from one of the conductive traces on the second surface, wherein the second and third vias are aligned such that an end of the second via opposes an end of the third via, and wherein the end of the second via is separated from the end of the third via by a dielectric substance, thereby increasing a resonant frequency of the resonator.

2. The resonator of claim 1, wherein the substrate is a printed circuit board.

3. The resonator of claim 2, wherein the printed circuit board has a circuit formed thereon, and wherein the circuit is conductively coupled to the resonator.

4. The resonator of claim 1, wherein the dielectric substance comprises air.

5. A resonator, comprising:
   a capacitor embedded solenoid embedded in a substrate composed of dielectric material, the solenoid having a plurality of conductive traces on a first surface of the substrate, a plurality of conductive traces on a second surface of the substrate, and a plurality of conductive vias extending through the substrate between the conductive traces on the first surface and the conductive traces on the second surface, the plurality of conductive vias including at least a first via, a second via, and a third via,
   wherein the first via extends from one of the traces on the first surface to one of the traces on the second surface, wherein the second conductive via extends from one of the traces on the first surface, wherein the third via extends from one of the conductive traces on the second surface, and wherein an end of the second via is separated from an end of the third via by a capacitive gap comprising a dielectric material, thereby increasing a resonant frequency of the resonator.

6. A system, comprising:
   a dielectric substrate;
   a circuit formed on the substrate; and
   a resonator embedded within the substrate and conductively coupled to the circuit, the resonator comprising a solenoid having a plurality of conductive vias extending through the dielectric substrate, wherein the plurality of conductive vias include at least a first via, a second via, and a third via, and wherein an end of the second via is separated from an end of the third via by a dielectric substance such that the second and third vias and the dielectric substance form a capacitor that is embedded within the solenoid for increasing a resonant frequency of the resonator.

7. The system of claim 6, wherein the solenoid has a plurality of conductive traces on a first surface of the substrate and a plurality of conductive traces on a second surface of the substrate, the plurality of conductive vias extending through the substrate between the conductive traces on the first surface and the conductive traces on the second surface, wherein the first via extends from one of the traces on the first surface to one of the traces on the second surface, wherein the second conductive via extends from one of the traces on the first surface, and wherein the third via extends from one of the conductive traces on the second surface.

8. The system of claim 7, wherein the dielectric substance comprises a portion of the substrate.

9. The system of claim 7, wherein the dielectric substance comprises air.

10. The system of claim 6, wherein the substrate is a printed circuit board.

11. A method of embedding a resonator in a substrate, comprising the steps of:
   providing a substrate composed of dielectric material;
   forming a plurality of conductive traces on the substrate, the plurality of conductive traces including at least a first trace, a second trace, and a third trace; and
   forming a plurality of conductive vias in the substrate, the plurality of conductive vias including a first via, a second via, and a third via, wherein the first via extends from the first trace to the second trace, wherein the second via extends from the first trace, wherein the third via extends from the third trace, and wherein an end of the second via is separated from an end of the third via by a capacitive gap comprising a dielectric substance, thereby increasing a resonant frequency of the resonator.

12. The method of claim 11, wherein the forming the plurality of conductive vias step comprises the steps of:
   forming a first hole in the substrate; and
   filling at least a portion of the first hole with conductive material thereby forming the third via.

13. The method of claim 12, wherein the forming the plurality of conductive vias step comprises the step of filling at least a portion of the first hole with conductive material thereby forming the second via.

14. The method of claim 12, wherein the forming the plurality of conductive vias step comprises the steps of:
   forming a second hole in the substrate, the second hole aligned with the first hole; and
   filling at least a portion of the second hole with conductive material thereby forming the second via.

15. The method of claim 12, wherein the forming the first hole step comprises the step of drilling the first hole in the substrate.

* * * * *